United States Patent
Nakagawa

(10) Patent No.: US 8,757,898 B2
(45) Date of Patent: Jun. 24, 2014

(54) OPTICAL COUPLING STRUCTURE AND ARRAY OPTICAL AMPLIFICATION MODULE

(71) Applicant: Fujitsu Limited, Kawasaki (JP)

(72) Inventor: Goji Nakagawa, Sagamihara (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/751,418

(22) Filed: Jan. 28, 2013

(65) Prior Publication Data

US 2013/0236143 A1 Sep. 12, 2013

(30) Foreign Application Priority Data

Mar. 9, 2012 (JP) ................................. 2012-053860

(51) Int. Cl.
*G02B 6/36* (2006.01)

(52) U.S. Cl.
USPC .................... 385/89; 385/17; 385/33; 385/50; 385/88

(58) Field of Classification Search
USPC .................... 385/17, 33, 50, 88–92
See application file for complete search history.

(56) References Cited

U.S. PATENT DOCUMENTS

| | | | |
|---|---|---|---|
| 7,702,197 B2 * | 4/2010 | Nakagawa | 385/33 |
| 8,437,589 B2 * | 5/2013 | Nakagawa | 385/33 |
| 2008/0101747 A1 * | 5/2008 | Nakagawa | 385/17 |
| 2008/0226229 A1 | 9/2008 | Nakagawa | |
| 2010/0215072 A1 * | 8/2010 | Funabashi | 372/50.12 |
| 2011/0081112 A1 | 4/2011 | Nakagawa | |

FOREIGN PATENT DOCUMENTS

JP 2008-77071 4/2008

OTHER PUBLICATIONS

Goji Nakagawa et al., "High-speed and High-reliability Optical Selector for 256×256 Large-scale, Nanosecond-order Optical Switching", Optical Fiber Communication Conference (OFC), Feb. 2, 2008, 3 pages.
Extended European Search Report issued Feb. 7, 2014 in corresponding European Patent Application No. 13153992.6.

* cited by examiner

*Primary Examiner* — Ellen Kim
(74) *Attorney, Agent, or Firm* — Staas & Halsey LLP

(57) ABSTRACT

An optical coupling structure includes an optical amplifier array configured to include a plurality of optical amplifiers arranged in an array direction, an optical fiber array configured to include a plurality of optical fibers arranged in the array direction, and an optical coupling system that optically couples the optical amplifier array and the optical fiber array, wherein, in a non-array direction orthogonal to the array direction, the optical coupling system optically couples beams of light signals to an end face of the optical amplifier array in parallel with a waveguide direction of the optical amplifiers, and optically couples the beams to an end face of the optical fiber array obliquely to the end face of the optical fiber array in the non-array direction.

8 Claims, 8 Drawing Sheets

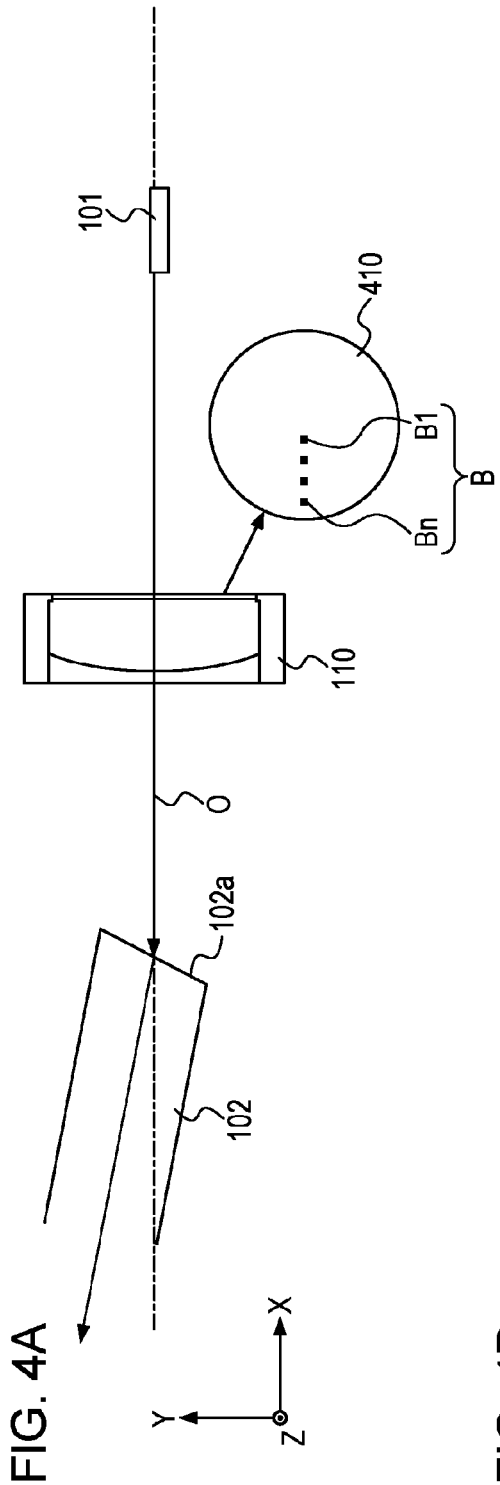
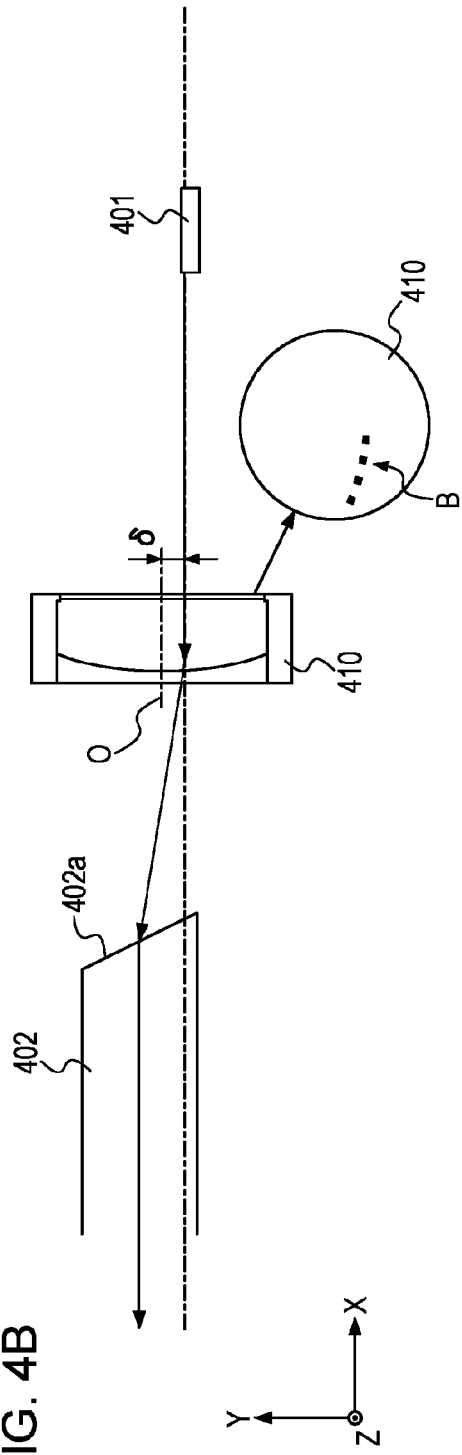

OPTICAL COUPLING STRUCTURE AND ARRAY OPTICAL AMPLIFICATION MODULE

CROSS-REFERENCE TO RELATED APPLICATION

This application is based upon and claims the benefit of priority of the prior Japanese Patent Application No. 2012-053860, filed on Mar. 9, 2012, the entire contents of which are incorporated herein by reference.

FIELD

The embodiment discussed herein is related to an optical coupling structure that optically couples beams of light signals to optical elements, and an array optical amplification module including this structure.

BACKGROUND

For example, Japanese Laid-open Patent Publication No. 2008-077071 (FIG. 8 of this publication) discusses, as an optical amplification module that amplifies light signals, an array optical amplification module including an optical amplifier array in which a plurality of semiconductor optical amplifiers (SOAs) are arrayed. Light signals of a plurality of channels are input from an optical fiber array provided on one side to the array optical amplification module, are optically amplified and switched by the SOAs, and are then output to optical fibers in an optical fiber array provided on the other side.

In the above-described array optical amplification module, reflection of light signals at end faces of the optical fibers and end faces of the SOAs (edge reflection) is suppressed to reduce optical coupling loss. For this reason, beams of light signals are obliquely incident on and emergent from the optical fiber array and the SOAs. Specifically, a plurality of (two) lenses are provided between the optical fiber array and the SOAs, and the beams of the light signals pass the lenses while being shifted by a predetermined offset amount from the centers of the lenses. Imaging is performed while the centers of the two lenses are substantially aligned by this confocal lens system, so that the beams of the light signals may become oblique to the end faces of the optical fibers (the end faces of the SOAs).

However, in the above-described related art, the optical coupling loss between the end faces of the optical fiber array and the end faces of the SOAs have wavelength dependence, and the optical coupling loss differs among a plurality of channels (wavelengths). The beams of the light signals at the end faces of the SOAs are optically coupled obliquely to the array direction, and the beams of the light signals at the end face of the optical fiber array are also optically coupled obliquely to the array direction. Thus, all reflecting directions of light overlap with the array direction, and this increases the wavelength dependence of the optical coupling loss.

To reduce the wavelength dependence of the optical coupling loss, the beams of the light signals are not inclined in the array direction at the end face of the optical fiber array, but are made incident in parallel with the axial direction of the optical fibers (perpendicular to the array direction). However, if the structure is simply changed so that the beams of the light signals are incident on the optical fibers in parallel, the beams are reflected by edge reflection of the optical fibers, and enter the SOAs. This degrades the characteristics of the SOAs. In the structure in which the beams of the light signals are incident in parallel with the axial direction of the optical fibers, edge reflection may be suppressed by obliquely forming the end faces of the optical fibers in the optical fiber array, but it is difficult to form the end faces of the optical fibers obliquely in the array direction.

FIG. 8 depicts the problem of edge reflection of the optical fiber array. When a plurality of optical fibers arranged in the array direction in the optical fiber array are collectively made oblique in the array direction, the positions of the end faces of the optical fibers (distances from the lenses) become different. For this reason, it is assumed that the fiber axis direction of an optical fiber array 800 is set parallel to an optical axis direction Z such that beams of light signals are incident in parallel, as illustrated in FIG. 8. In this case, in order for the positions of end faces 800$aa$ to 800$na$ of a plurality of optical fibers 800$a$ to 800$n$ in the optical fiber array 800 to be arranged in an array direction X at the same distance from a lens 801, each of the end faces 800$aa$ to 800$na$ of the optical fibers 800$a$ to 800$n$ is formed obliquely to the beams (the optical axis direction Z). This formation is troublesome and realistically difficult.

SUMMARY

According to an aspect of the embodiments, an optical coupling structure includes an optical amplifier array configured to include a plurality of optical amplifiers arranged in an array direction, an optical fiber array configured to include a plurality of optical fibers arranged in the array direction, and an optical coupling system that optically couples the optical amplifier array and the optical fiber array, wherein, in a non-array direction orthogonal to the array direction, the optical coupling system optically couples beams of light signals to an end face of the optical amplifier array in parallel with a waveguide direction of the optical amplifiers, and optically couples the beams to an end face of the optical fiber array obliquely to the end face of the optical fiber array in the non-array direction.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 4A and 4B are side views illustrating a structure for suppressing edge reflection;

DESCRIPTION OF EMBODIMENT

Optical Coupling State Between SOA Array and Optical Fiber Array

Figure 1:
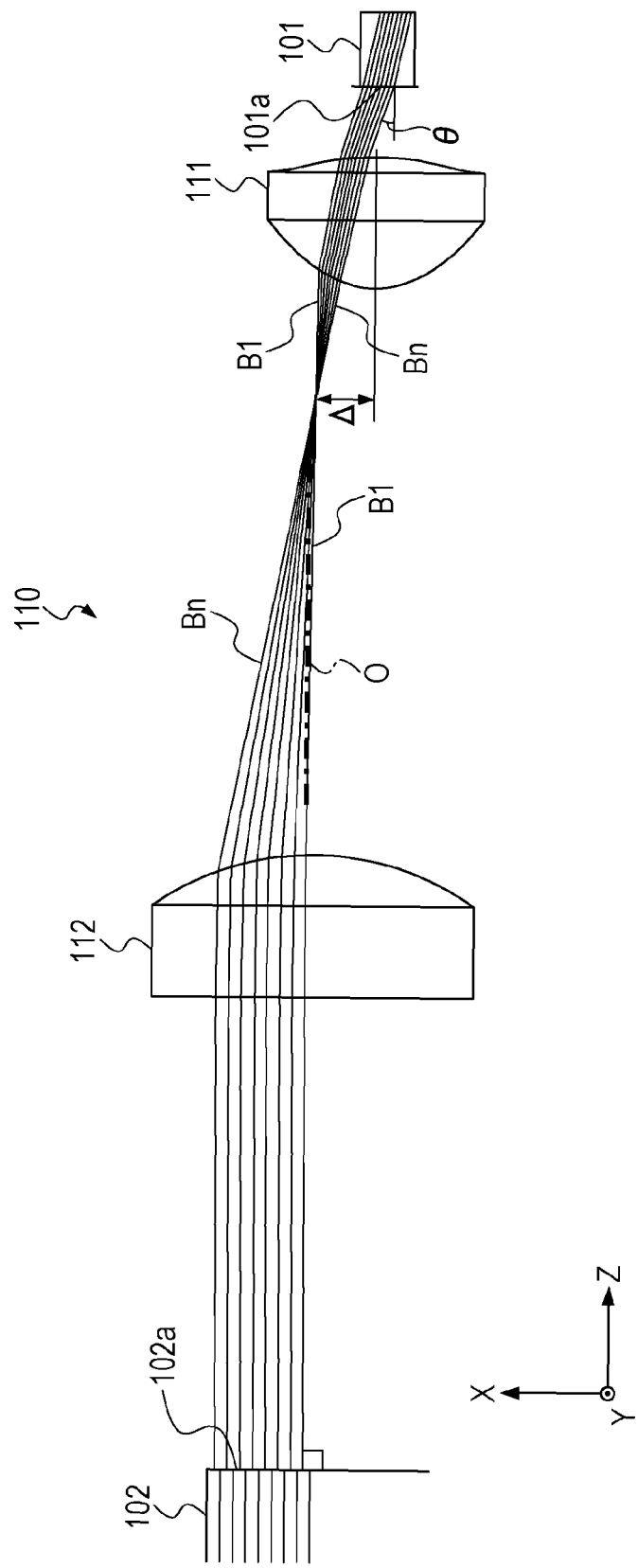
FIG. 1 is a top view illustrating an optical coupling state of an optical coupling system according to an embodiment.
Figure 2:
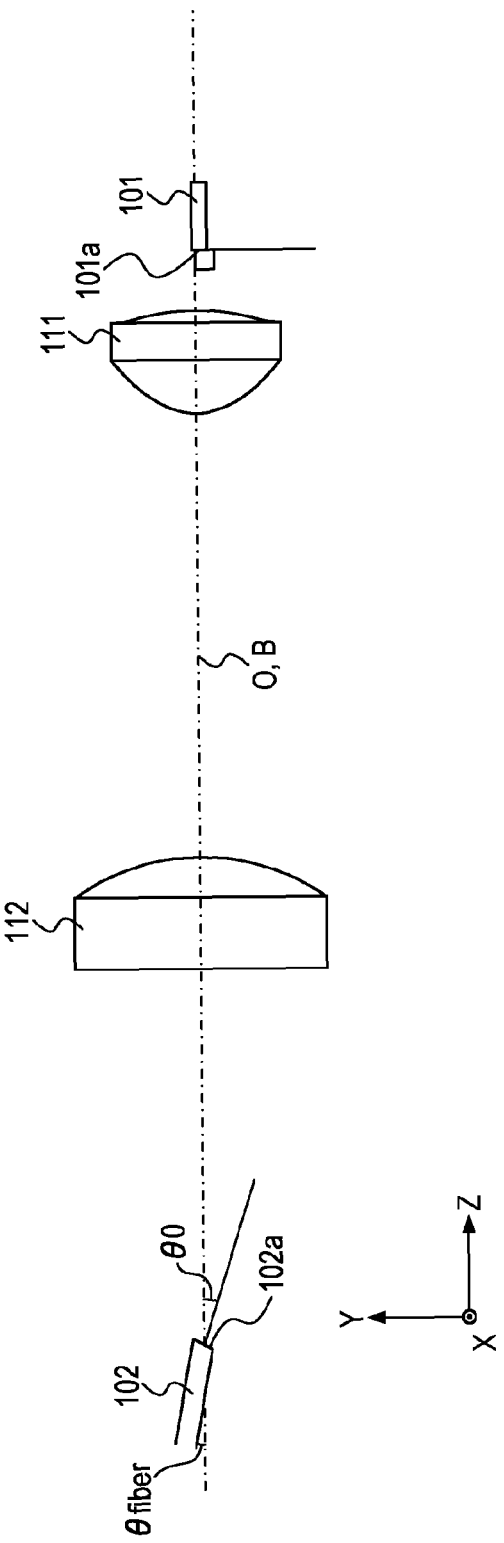
FIG. 2 is a side view illustrating the optical coupling state of the optical coupling system of the embodiment.

The disclosed embodiment will be described below with reference to the accompanying drawings. FIG. 1 is a top view illustrating an optical coupling state of an optical coupling system according to the embodiment. FIG. 2 is a side view illustrating the optical coupling state of the optical coupling system of the embodiment. These drawings illustrate a multichannel optical coupling system 110 provided between an optical fiber array and an optical amplifier array. In the drawings, X represents an array direction of an SOA array, Y represents a height direction (it is also called a non-array direction) orthogonal to the array direction, and Z represents an optical axis direction.

As illustrated in FIG. 1, the optical coupling system 110 optically couples a semiconductor optical amplifier (SOA) array 101 serving as an optical amplifier array and an optical fiber array 102. As for the direction of beams of light signals, the beams may be emitted from the SOA array 101 to the optical fiber array 102, or may be emitted from the optical fiber array 102 to the SOA array 101.

The optical coupling system 110 includes a first lens 111 and a second lens 112. As illustrated in FIG. 1, an end face 101a of the SOA array 101, a principal surface of the first lens 111, a principal surface of the second lens 112, and an end face 102a of the optical fiber array 102 are arranged in parallel with one another, and are formed in the array direction X.

In the semiconductor optical amplifier (SOA) array 101, a plurality of (e.g., eight for eight channels) SOAs are arrayed with a predetermined pitch in the array direction X. Similarly, in the optical fiber array 102, a plurality of fibers are arrayed with a predetermined pitch in the array direction X. For example, in the case of eight channels, a beam group of eight beams is included, and the eight beams have a predetermined pitch. The beams illustrated in FIG. 1 represent the center lines of intensity distributions. Each of the end face 101a of the SOA array 101 and the end face 102a of the optical fiber array 102 is provided with an anti-reflection (AR) coating film.

First, a description will be given of an optical coupling state with reference to FIG. 1 serving as a top view. The center position of the end face 101a of the SOA array 101 (the center position of the beam group) is located in correspondence to almost the center position of the first lens 111 with a predetermined space therebetween. The beam group passes through an area of the first lens 111 on one side of the center in the array direction X. To the end face 101a of the SOA array 101, the beam group of light signals from a plurality of SOAs in the SOA array 101 are optically coupled at a predetermined angle θ to the array direction X.

The first lens 111 optically couples the beam group while refracting the beam group on a side of the SOA array 101 at the predetermined angle θ and refracting the beam group on a side of the second lens 112. A beam B1 that refracts most among the beam group passing through the first lens 111 is caused to pass through a center axis O of the second lens 112, and the other beams to a beam Bn at an outer side are caused to pass through an outer area of the second lens 112.

As illustrated in FIG. 1, the first lens 111 and the second lens 112 are arranged such that the center positions thereof are shifted from each other by an offset amount Δ. Similarly to the first lens 111, the beam group passes through an area of the second lens 112 on one side in the array direction X.

As illustrated in FIG. 1, the first lens 111 greatly refracts the beams of the light signals in the array direction X, and the second lens 112 refracts the beams less than in the first lens 111. Between the second lens 112 and the optical fiber array 102, the beams of the light signals are substantially parallel to one another, and are optically coupled in parallel with the fiber axis of the optical fiber array 102 at the end face 102a of the optical fiber array 102.

As illustrated in FIG. 1, the end face 102a of the optical fiber array 102 extends in the array direction X, and is at a right angle to the optical axis direction Z. Thus, the beams of the light signals are incident on the end face 102a of the optical fiber array 102 at a right angle, when viewed from the upper side.

As illustrated in FIG. 2, a beam B of a light signal coincides with the center axis O of the second lens 112 in the height direction Y in the optical coupling system 110. That is, a light incident and emergent position of the SOA array 101, the center position of the first lens 111, the center position of the second lens 112, and the end face position of the optical fiber array 102 are all located on the center axis O. A direction in which the light signal is guided in the SOA array 101 (a plane in which the SOA array 101 is provided) is parallel to the beam B. The principal surfaces of the first lens 111 and the second lens 112 are parallel to each other, and extend in the height direction Y.

In this embodiment, as illustrated in FIG. 2, the center of the first lens 111 and the center of the second lens 112 are aligned in the height direction Y (the direction orthogonal to the array direction X) in side view, but there is no offset. Further, in side view, a surface of the optical fiber array 102 (a plane in which the optical fiber array 102 is provided) is inclined at a predetermined angle °fiber to the center axis O in the height direction.

The end face 102a is formed by an inclined face inclined at a predetermined angle θ0 to the center axis O. The end face 102a is not perpendicular to the fiber axis of the optical fiber array 102, but is inclined at a predetermined angle θ1 to the fiber axis, as will be described below.

For example, when the image magnification is 3, the optical coupling system 110 converts a pitch of 60 μm of light emitted from the SOAs in the SOA array 101 into a pitch of 180 μm at the end face 102a of the optical fiber array 102. Further, the mode size of the SOA array 101 is enlarged three times to be substantially equal to the mode size of the optical fibers (e.g., single-mode fibers) in the optical fiber array 102. This achieves efficient optical coupling.

Figure 3:
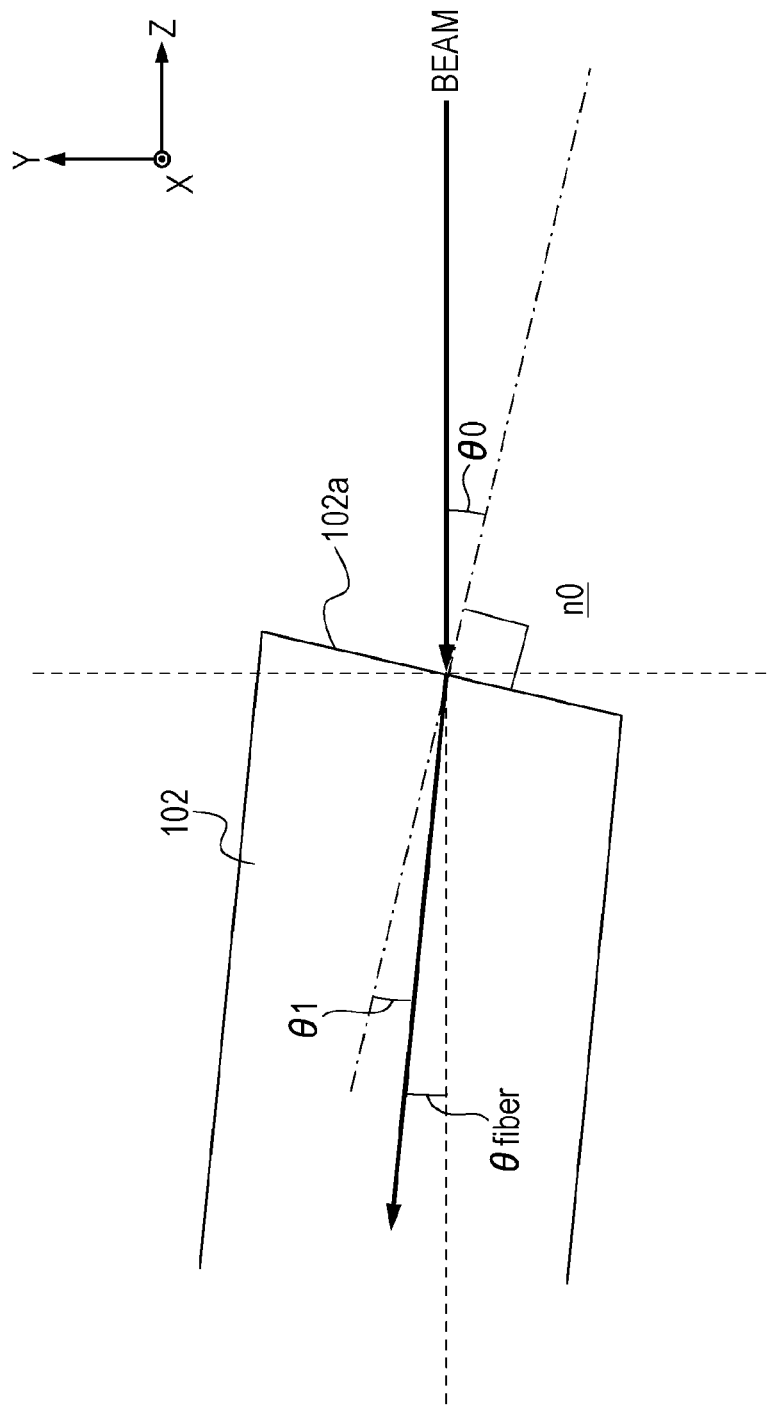
FIG. 3 is an enlarged side view of an optical fiber array illustrated in FIG. 2.

FIG. 3 is an enlarged side view of the optical fiber array 102 illustrated in FIG. 2. A description will be given of a case in which the end face 102a of the optical fiber array 102 optically couples a beam on the center axis O, for example, at an angle θ0 of 8 degrees. Here, it is assumed that a refractive index n1 of the optical fibers is 1.5, a refractive index n0 of air is 1.0, an angle of the end face 102a of the optical fiber array 102 with respect to the center axis O is designated as θfiber, and an angle of the end face 102a of the optical fiber array 102 with respect to a direction orthogonal to the fiber axis of the optical fiber array 102 is designated as θ1. In this case, $n1 \cdot \sin\theta1 = n0 \cdot \sin\theta0$ according to Snell's law. For example, the angle °fiber of the optical fibers may be 2.7 degrees, and the angle θ1 of the end face 102a of the optical fiber array 102 may be 5.3 degrees. Further, $\theta0 = \theta\text{fiber} + \theta1$.

The end face 102a of the optical fiber array 102 can be easily formed at one time, for example, by obliquely cutting the optical fiber array 102 at the predetermined angle θ1 in the height direction Y with a linear cutter having a length in the array direction X. Further, end faces of a plurality of optical fibers in the optical fiber array 102 may all be formed as inclined faces having the same predetermined angle θ1.

Structure for Suppressing Edge Reflection

FIGS. 4A and 4B are side views illustrating a structure for suppressing edge reflection. FIGS. 4A and 4B are side views similar to FIG. 2. As illustrated in FIG. 4A, the optical coupling system 110 of the embodiment (the first lens 111 and the second lens 112) has no offset in the height direction Y between the SOA array 101 and the optical fiber array 102. Here, the center of the first lens 111 is provided on the center axis O of the second lens 112 so that the center axis O coincides with the position of a beam of a light signal.

Thus, a group B of beams B1 to Bn of light signals in FIGS. 4A and 4B passes through the center positions of the first lens 111 and the second lens 112. Hence, the beams B1 to Bn are arranged on a straight line extending in the array direction X, and can be efficiently and optically coupled to the end face 102a of the optical fiber array 102 linearly extending in the array direction X.

FIG. 4B illustrates a structure of the related art for comparison. In this structure, a group B of beams of light signals passes with an offset amount δ in the height direction Y through an optical coupling system 410 between an SOA array 401 and an optical fiber array 402. Strictly, although not illustrated, a second lens is shifted from a first lens by the offset amount δ in the height direction Y. Since the beams of the light signals in the group B pass while being shifted from the center of the optical coupling system 410 by the offset amount δ, they are not arranged on a straight line extending the array direction X, but are arranged in a curve. Hence, it is difficult for the beams of the light signals to be efficiently and optically coupled to an end face 402a of the optical fiber array 402 linearly extending in the array direction X.

Figure 5A:
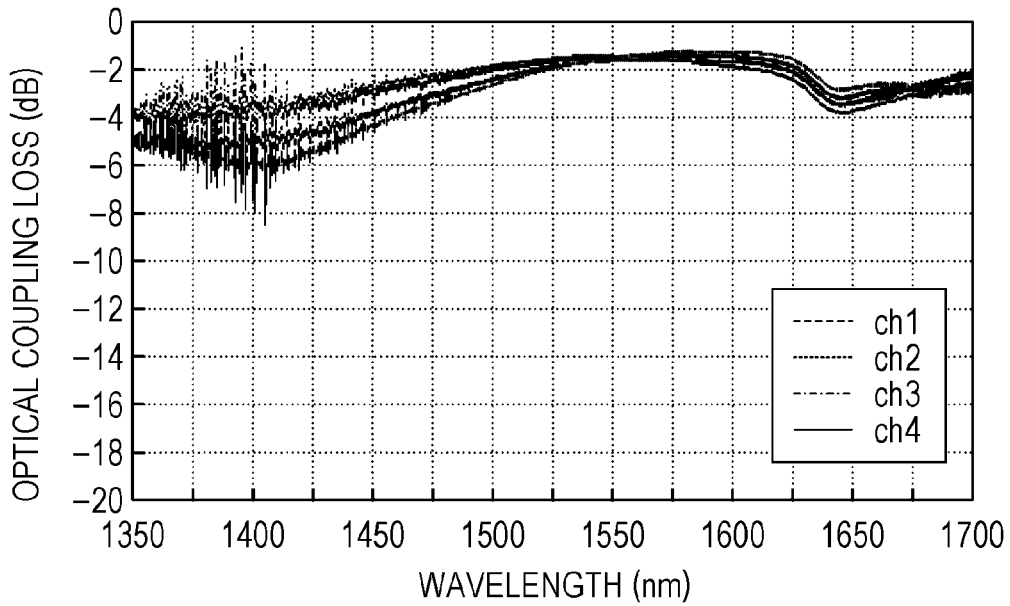
FIGS. 5A and 5B are graphs depicting the optical coupling loss in the optical coupling system of the embodiment.
Figure 5B:
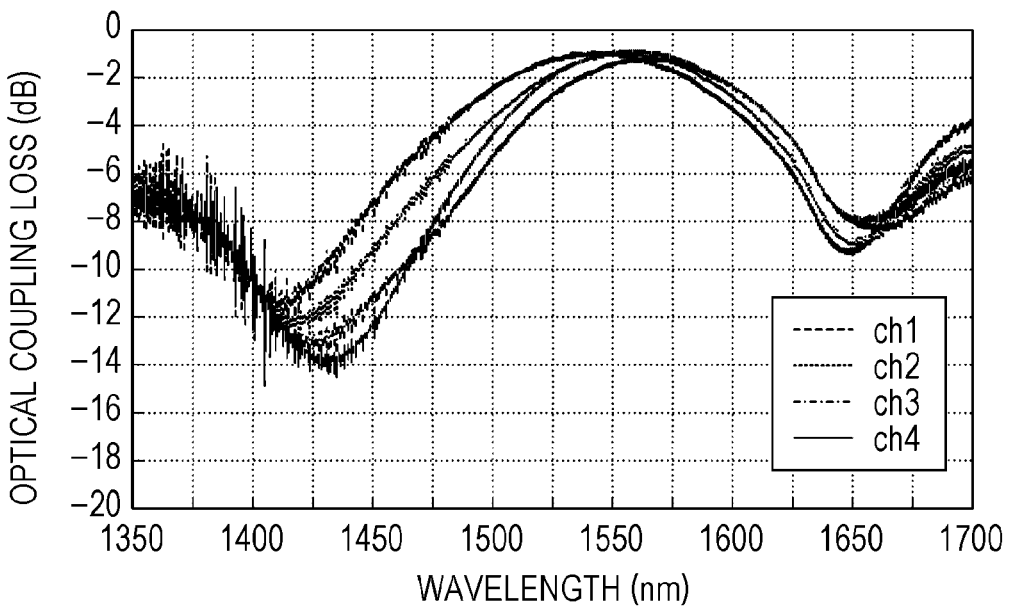

FIGS. 5A and 5B are graphs depicting the optical coupling loss of the optical coupling system. In FIGS. 5A and 5B, the horizontal axis indicates the wavelength, and the vertical axis indicates the optical coupling loss. As depicted in FIG. 5A, according to the optical coupling system 110 of the embodiment, the optical coupling loss is about −8 dB at the maximum, and the characteristic line is flat over the entire wavelength range. As a result, the optical coupling loss can be suppressed, and the SOA array 101 and the optical fiber array 102 may be optically coupled with high efficiency. Also, differences in optical coupling loss among channels ch1 to ch4 may be reduced, and the wavelength dependence of the optical coupling loss among the channels may be reduced.

For comparison, FIG. 5B depicts the characteristic of an optical coupling system of the related art in which beams of light signals are obliquely incident on an optical fiber array 102. In this case, the optical coupling loss increases near a wavelength of 1425 nm and near a wavelength of 1650 nm in all channels (ch1 to ch4), and it is −14 dB at the maximum. The characteristic line curves such that the optical coupling loss greatly differs according to the wavelength. Further, there are large differences in optical coupling loss among the channels ch1 to ch4. In this way, the wavelength dependence of the optical coupling loss is strong in the structure of the related art.

Exemplary Structure of Array Optical Amplification Module

Figure 6:
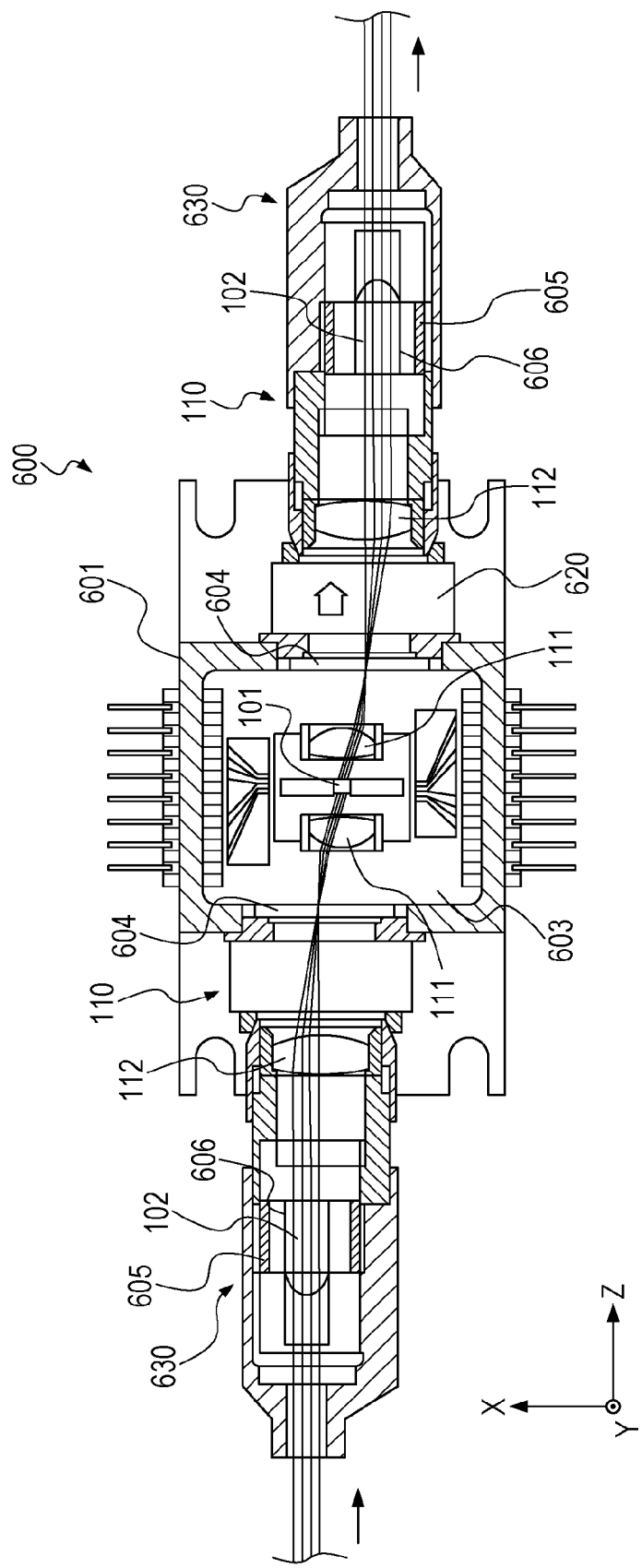
FIG. 6 is a top view illustrating an exemplary structure of an optical amplification module according to the embodiment.
Figure 7:
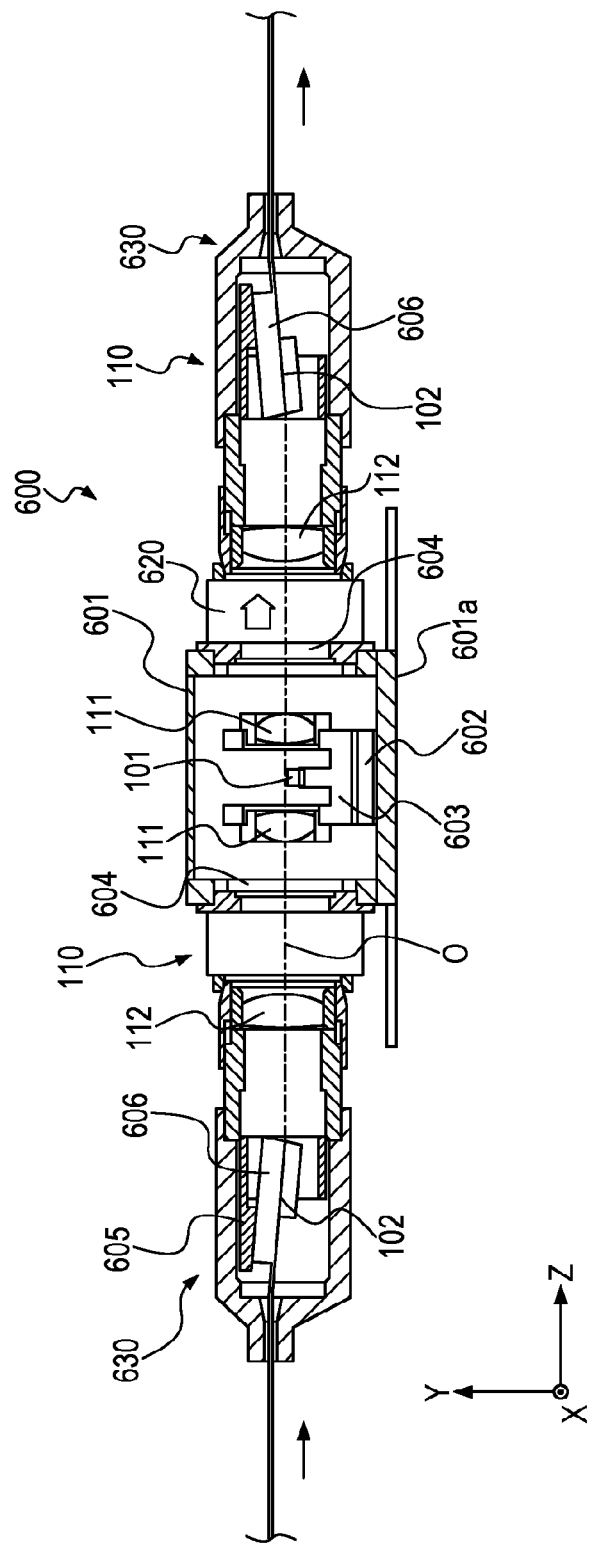
FIG. 7 is a side view illustrating the exemplary structure of the optical amplification module of the embodiment.
Figure 8:
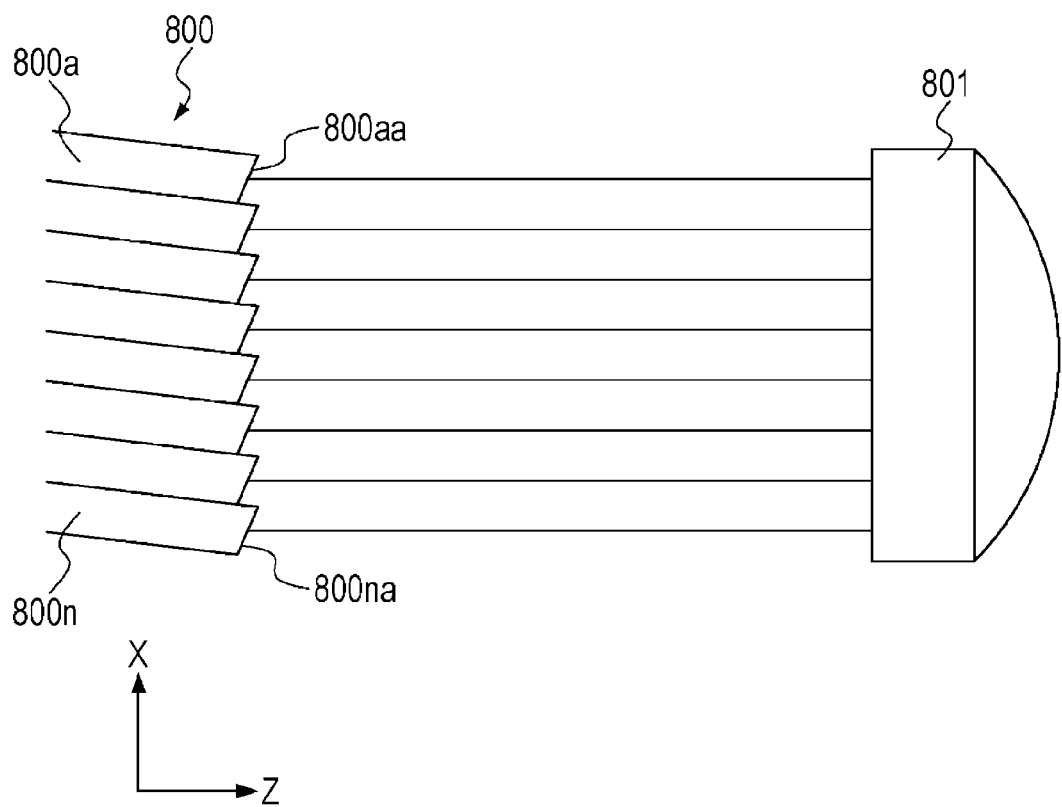
FIG. 8 depicts a problem of edge reflection of an optical fiber array.

Next, a description will be given of an exemplary structure of an array amplification module 600 using the above-described optical coupling system 110 according to the embodiment. FIGS. 6 and 7 are a top view and a side view, respectively, illustrating the exemplary structure of the array optical amplification module 600. To the array optical amplification module 600, a pair of optical fiber arrays 102 are connected. Light signals from a plurality of (e.g., four channels) optical fibers, which are input from one of the optical fiber arrays 102 (left optical fiber array 102 in the drawings) are optically amplified by an SOA array 101, and are output to the other optical fiber array 102 (right optical fiber array 102 in the drawings).

In the array optical amplification module 600, a pair of optical connectors 630, such as metal sleeves, are connected to a package 601. A stem 603 is provided on a temperature regulator 602 (FIG. 7) such as a Peltier element, at the center of a base 601a (FIG. 7) of the package 601, and the SOA array 101 is provided at the center of the stem 603 (FIG. 7). On one side and the other side of the package 601 centered on the SOA array 101, the above-described optical coupling systems 110 are provided substantially symmetrically. As illustrated in FIG. 6, optical paths of beam groups from the optical coupling systems 110 are substantially point-symmetric with respect to the SOA array 101. In FIGS. 6 and 7, portions that constitute the optical coupling systems 110 are denoted by the same reference numerals.

At one end of the stem 603, first lenses 111 are provided at a predetermined distance from the SOA array 101. Side faces of the package 601 have openings corresponding to the optical paths of the optical coupling systems 110, and hermetical sealing windows 604, which are formed of glass for example, are provided in the openings. In each of the optical connectors 603, a second lens 112 is provided at an end, and a corresponding optical fiber array 102 is fixed to the center.

As illustrated in FIG. 6, a plurality of SOAs and a plurality of optical fibers are arranged in the array direction X, respectively, in the SOA array 101 and the optical fiber arrays 102, in top view. As illustrated in FIG. 1 described above, the first lens 111 and the second lens 112 in each of the optical coupling systems 110 refract beams of light signals in the array direction X, and optically couple the SOA array 101 and the optical fiber array 102.

As illustrated in FIG. 7, the optical axes of the SOA array 101, the first lens 111, the second lens 112, and the optical fiber array 102 are all located on the horizontal center axis O. As illustrated in FIG. 7, the optical fiber array 102 is inclined at the above-described predetermined angle θfiber to the optical axis direction Z, and an end face 102a thereof has a predetermined inclination angle θ1. Specifically, a holder 605 is provided in each of the optical connectors 630 to hold a ferrule 606 at an end of the corresponding optical fiber array 102 at the predetermined angle ° fiber to the center axis O.

When the focal length of the first lens 111 is designated as f1 and the focal length of the second lens 112 is designated as f2, the SOA array 101 and the first lens 111 constitute a confocal system, and the SOA array 101 is located at the focal length f1 of the first lens 111. Also, the second lens 112 and the optical fiber array 102 constitute a confocal system, and the optical fiber array 102 is located at the focal length f2 of the second lens 112. In this case, the image magnification is determined to coincide with the ratio between beam spot sizes of the SOAs in the SOA array 101 and the beam spot sizes of the optical fibers in the optical fiber array 102, and the image magnification is equal to f2/f1.

The above-described optical coupling system 110 is also provided on the other side of the SOA array 101 in FIGS. 6 and 7 (right side in FIGS. 6 and 7). The SOA array 101 is provided at both ends with the above-described pair of optical coupling systems 110, and amplifies light signals passing therethrough. Thus, light signals of a plurality of channels input from one of the optical fiber arrays 102 may be optically amplified by the SOA array 101, and can be output from the other optical fiber array 102. In the right optical coupling system 110, an optical isolator 620 is provided between the first lens 111 and the second lens 112 to avoid return of reflected light.

The exemplary structure of the array optical amplification module 600 that amplifies light signals of a plurality of channels has been described above. As an example of an array optical module having a similar optical coupling system 110, the embodiment may be applied to an optical gate device in which the number of input channels is N and the number of output channels is 1, which includes an SOA array and an N:1 coupler, and which may perform N:1 switching of light signals. In this case, an optical fiber array is provided on the input side, and a single optical fiber is provided on the output side. Also, the embodiment may be applied to an optical gate device which includes an SOA array and an M×N matrix switch and which may subject light signals to switching of input M:output N. In this case, an optical fiber array is provided at each of the input and output sides.

As described above, according to the embodiment, the optical coupling system 110 performs optical coupling while the beam is not inclined in the array direction X at the end face 102a of the optical fiber array 102 and the fiber axis of the optical fiber array 102 is parallel to the optical axis direction Z (orthogonal to the array direction X), as viewed from one surface (upper surface). In contrast, the optical coupling system 110 performs optical coupling while the end face 102a of the optical fiber array 102 is inclined with respect to the beam, as viewed from the other surface (side surface) orthogonal to the one surface.

In this way, the SOA array 101 adopts a combination of the structure for performing optical coupling obliquely to the array direction X, as viewed from the top surface, and the structure for performing optical coupling obliquely to the height direction Y, as viewed from the side surface. Thus, while the light is refracted by the first lens 111 and the second lens 112 in the array direction X, the light is refracted by the inclined end face 102a of the optical fiber array 102 in the height direction Y. This may realize both reduction of reflection at the end face 102a of the optical fiber array 102 and reduction in wavelength dependence of the optical coupling loss.

Particularly when the optical coupling system 110 is applied to the structure in which beams of light signals are emitted from the SOA array 101 to the optical fiber array 102, the beams incident on the end face 102a of the optical fiber array 102 are restrained from reflection, and unnecessary oscillation of the SOA array 101 due to reflected light is suppressed. This avoids degradation of the characteristics.

While the SOAs are used as the optical amplifiers in the above embodiment, alternatively, optical amplification waveguides, for example, erbium doped waveguides (EDWGs) arranged in the array direction X may be used.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An optical coupling structure, comprising:
an optical amplifier array configured to include a plurality of optical amplifiers arranged in an array direction;
an optical fiber array configured to include a plurality of optical fibers arranged in the array direction; and
an optical coupling system that optically couples the optical amplifier array and the optical fiber array,
wherein, in the array direction, the optical coupling system optically couples beams of light signals to an end face of the optical amplifier array obliquely to the end face, and optically couples the beams to an end face of the optical fiber array in parallel with a fiber axis of the optical fiber array, and
wherein, in a height direction orthogonal to the array direction, the optical coupling system optically couples the beams to the end face of the optical amplifier array in parallel with a waveguide direction of the optical amplifiers, and optically couples the beams to the end face of the optical fiber array obliquely to the end face of the optical fiber array in the height direction.

2. The optical coupling structure according to claim 1,
wherein the optical coupling system includes an optical lens,
wherein the beams pass through a center of the optical lens in the height direction, and
wherein the fiber axis of the optical fiber array is inclined at a predetermined angle to the beams in the height direction, and the end face of the optical fiber array is inclined at a predetermined angle to the beams in the height direction.

3. The optical coupling structure according to claim 2,
wherein the plurality of optical fibers at the end face of the optical fiber array have the same angle equal to the predetermined angle by being cut in the array direction.

4. The optical coupling structure according to claim 2,
wherein the optical coupling system includes a first lens provided on a side of the optical amplifier array and a second lens provided on a side of the optical fiber array,
wherein a principal surface of the first lens, a principal surface of the second lens, the end face of the optical amplifier array, and the end face of the optical fiber array are parallel to one another in the array direction,
wherein a center beam at an optical coupling position of the optical amplifier array is located at almost a center position of the first lens,
wherein the first lens is provided such that the beams pass through an area of the first lens on one side and a beam that refracts most among the beams passing through the first lens passes through a center position of the second lens.

5. The optical coupling structure according to claim 4,
wherein the center position of the first lens and the center position of the second lens in the optical coupling system are shifted from each other by a predetermined offset amount in the array direction.

6. The optical coupling structure according to claim 4,
wherein the center position of the first lens and the center position of the second lens in the optical coupling system are located on an optical axis between the end face of the optical amplifier array and the end face of the optical fiber array in the height direction.

7. The optical coupling structure according to claims 4,
wherein a refractive index of the first lens is high and a refractive index of the second lens is low.

8. An array optical amplification module, comprising:
an optical amplifier array configured to include a plurality of optical amplifiers arranged in an array direction;
an optical fiber array configured to include a plurality of optical fibers arranged in the array direction; and
an optical coupling system that optically couples the optical amplifier array and the optical fiber array,
wherein, in the array direction, the optical coupling system optically couples beams of light signals to an end face of the optical amplifier array obliquely to the end face, and optically couples the beams to an end face of the optical fiber array in parallel with a fiber axis of the optical fiber array,
wherein, in a height direction orthogonal to the array direction, the optical coupling system optically couples the beams to the end face of the optical amplifier array in parallel with a waveguide direction of the optical amplifiers, and optically couples the beams to the end face of the optical fiber array so that the beams are inclined in the height direction with respect to the end face of the optical fiber array, and
wherein the optical coupling system is located at one or both of a pair of input and output sides of the optical amplifier array, and a plurality of light signals are amplified by the optical amplifier array.

* * * * *